(12) United States Patent
Jiang et al.

(10) Patent No.: US 11,800,823 B2
(45) Date of Patent: Oct. 24, 2023

(54) METHOD FOR MANUFACTURING THERMAL DISPERSION LAYER IN PROGRAMMABLE METALLIZATION CELL

(71) Applicant: Taiwan Semiconductor Manufacturing Co., Ltd., Hsin-Chu (TW)

(72) Inventors: Fa-Shen Jiang, Taoyuan (TW); Hsing-Lien Lin, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 276 days.

(21) Appl. No.: 17/165,088

(22) Filed: Feb. 2, 2021

(65) Prior Publication Data

US 2021/0159404 A1 May 27, 2021

Related U.S. Application Data (62) Division of application No. 16/114,607, filed on Aug. 28, 2018, now Pat. No. 10,916,697.

(60) Provisional application No. 62/692,354, filed on Jun. 29, 2018.

(51) Int. Cl.
  *H10N 70/20* (2023.01)
  *G11C 13/00* (2006.01)
  *H10N 70/00* (2023.01)

(52) U.S. Cl.
  CPC ....... *H10N 70/245* (2023.02); *G11C 13/0011* (2013.01); *H10N 70/063* (2023.02); *H10N 70/8265* (2023.02); *H10N 70/841* (2023.02); *H10N 70/8613* (2023.02)

(58) Field of Classification Search
  CPC . H01L 45/085; H01L 45/124; H01L 45/1253; H01L 45/1286; H01L 45/1675; G11C 13/0011; H10N 70/245; H10N 70/8265; H10N 70/8613; H10N 70/841; H10N 70/063
  See application file for complete search history.

(56) References Cited

U.S. PATENT DOCUMENTS

| 4,809,044 A * | 2/1989 | Pryor | H01L 45/141 257/77 |
|---|---|---|---|
| 8,283,198 B2 | 10/2012 | Wells | |
| 9,431,603 B1 | 8/2016 | Hsieh et al. | |
| 9,954,166 B1 | 4/2018 | Lin et al. | |
| 10,090,465 B2 | 10/2018 | Hsu et al. | |
| 10,522,740 B2 | 12/2019 | Chuang et al. | |

(Continued)

OTHER PUBLICATIONS

Non-Final Office Action dated Jul. 9, 2020 for U.S. Appl. No. 16/114,607.

(Continued)

*Primary Examiner* — Lex H Malsawma
(74) *Attorney, Agent, or Firm* — Eschweiler & Potashnik, LLC (57) ABSTRACT

Some embodiments relate to a method for manufacturing a memory device. The method includes forming a bottom electrode over a substrate. A heat dispersion layer is formed over the bottom electrode. A dielectric layer is formed over the heat dispersion layer. A top electrode is formed over the dielectric layer. The heat dispersion layer comprises a first dielectric material.

20 Claims, 8 Drawing Sheets

(56) References Cited

U.S. PATENT DOCUMENTS

| | | |
|---|---|---|
| 2007/0075347 A1* | 4/2007 | Lai .................. H01L 45/126 |
| | | 257/296 |
| 2007/0099377 A1* | 5/2007 | Happ ................ H01L 45/148 |
| | | 438/257 |
| 2012/0108031 A1 | 5/2012 | Lee et al. |
| 2014/0054537 A1 | 2/2014 | Lee et al. |
| 2014/0091273 A1 | 4/2014 | Lin et al. |
| 2014/0264230 A1* | 9/2014 | Borodulin .......... H01L 45/1226 |
| | | 257/4 |
| 2014/0268992 A1 | 9/2014 | Otsuka et al. |
| 2015/0194602 A1 | 7/2015 | Liao et al. |
| 2015/0255718 A1 | 9/2015 | Liu et al. |
| 2015/0295172 A1 | 10/2015 | Sung et al. |
| 2016/0049584 A1 | 2/2016 | Dang et al. |
| 2016/0064656 A1* | 3/2016 | Lin ................... H01L 45/1286 |
| | | 257/5 |
| 2016/0064664 A1 | 3/2016 | Dang et al. |
| 2017/0117467 A1 | 4/2017 | Chang et al. |
| 2017/0133584 A1 | 5/2017 | Tseng et al. |
| 2018/0033825 A1 | 2/2018 | Apodaca et al. |
| 2019/0305218 A1 | 10/2019 | Trinh et al. |

OTHER PUBLICATIONS

Notice of Allowance dated Oct. 9, 2020 for U.S. Appl. No. 16/114,607.

\* cited by examiner

METHOD FOR MANUFACTURING THERMAL DISPERSION LAYER IN PROGRAMMABLE METALLIZATION CELL

REFERENCE TO RELATED APPLICATIONS

This Application is a Divisional of U.S. application Ser. No. 16/114,607, filed on Aug. 28, 2018, which claims the benefit of U.S. Provisional Application No. 62/692,354, filed on Jun. 29, 2018. The contents of the above-referenced Patent Applications are hereby incorporated by reference in their entirety.

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Programmable metallization cell (PMC) random access memory (RAM), which may also be referred to as conductive bridging RAM, CBRAM, Nanobridge, or electrolytic memory, is one promising candidate for next generation non-volatile electronic memory due to advantages over current electronic memory. Compared to current non-volatile memory, such as flash random-access memory, PMCRAM typically has better performance and reliability. Compared to current volatile memory, such as dynamic random-access memory (DRAM) and static random-access memory (SRAM), PMCRAM typically has better performance and density, with lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A programmable metallization cell generally includes an electrolyte arranged between a top electrode and a bottom electrode. When a set voltage is applied across the top and bottom electrodes, a conductive bridge is formed within the electrolyte. When a reset voltage is applied across the top and bottom electrodes, the conductive bridge is erased within the electrolyte. In ideal conditions, the conductive bridge forms near the center of the programmable metallization cell.

During fabrication of the programmable metallization cell, high heat can accumulate near a top surface of the bottom electrode while applying the set and reset voltages due to the formation and deletion of the conductive bridge. The high heat can result in problems, such as a large variation of set/reset voltage due to erratic formation of the conductive bridge within the electrolyte. For example, in some embodiments, instead of the conductive bridge forming at the center of the electrolyte, the conductive bridge will form along the right or left hand edge of the electrolyte. In addition, the size and shape of the conductive bridge can change, causing the large variation in the set/reset voltage.

In some embodiments of the present disclosure, to make the formation of the conductive bridge more consistent over time in terms of shape and/or location, a heat dispersion layer may be disposed between the electrolyte and the bottom electrode. The heat dispersion layer dissipates heat that would otherwise accumulate at a top surface of the bottom electrode. This limits large variation of set/reset voltage, and causes the conductive bridge to form with a relatively consistent shape at a fixed central region in the electrolyte. The improvement in performance increases device stability, endurance, and read/write times.

Figure 1:
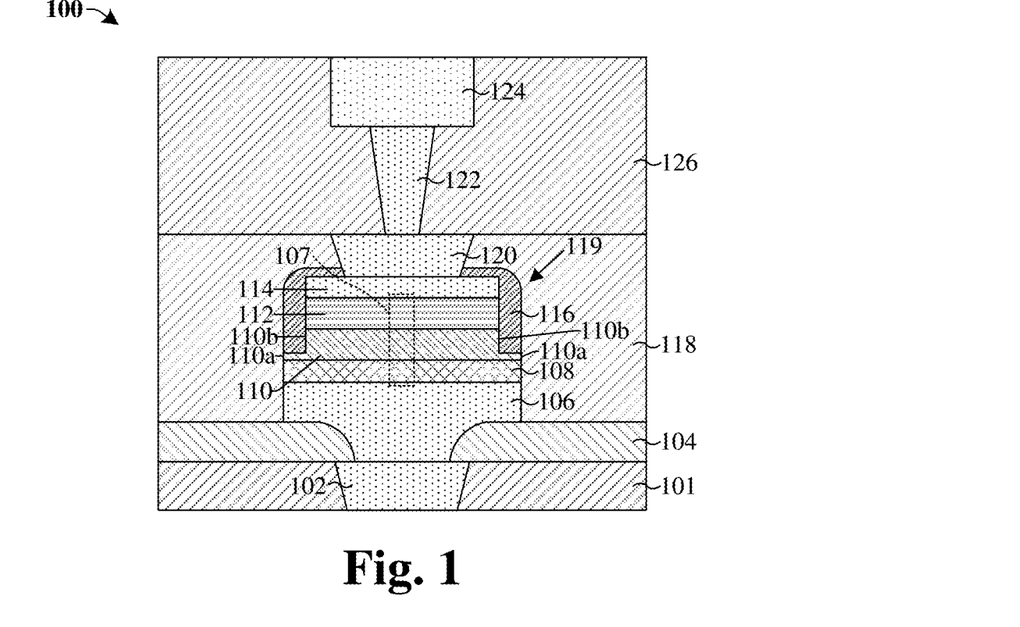
FIGS. 1, 2, 3A, and 3B illustrate cross-sectional views of some embodiments of a memory device including a programmable metallization cell, according to the present disclosure.

Referring to FIG. 1, a cross-sectional view of a PMCRAM device 100 in accordance with some embodiments is provided.

The PMCRAM device 100 includes a programmable metallization cell 119. The programmable metallization cell 119 includes a bottom electrode 106 and a top electrode 114, with a dielectric layer 110 (in some embodiments, also known as an electrolyte) disposed between the top electrode 114 and bottom electrode 106. A metal layer 112 (in some embodiments, also known as a metal ion reservoir) is disposed over the dielectric layer 110. In some cases, the metal layer 112 may be considered as part of the top electrode 114.

The programmable metallization cell 119 is often disposed over an inter-level dielectric (ILD) 101 with a dielectric layer 104 disposed over the ILD 101. A bottom interconnect via 102 connects the bottom electrode 106 to underlying metal layers and/or active devices of the device. A top electrode via 120 is disposed over the top electrode 114, and connects the top electrode 114 to upper metal layers (e.g., upper conductive wire 124). Thus, the programmable metallization cell 119 can reside within an inter-level dielectric (ILD) layer 118, and a second ILD layer 126 is disposed over the ILD layer 118. A first conductive via 122 is disposed over the top electrode via 120. The first conductive wire 124 extends past sidewalls of the first conductive via 122 and connects to a bit line (not shown).

In some embodiments, the dielectric layer 110 has a first pair sidewalls 110a that are aligned with outer sidewalls of the bottom electrode 106. A sidewall spacer 116 surrounds the outer sidewalls of the top electrode 114, the outer sidewalls of the metal layer 112 and the second pair of outer sidewalls 110b of the dielectric layer 110. The first pair of outer sidewalls 110a has a greater width than a second pair of outer sidewalls 110b. A bottom surface of the sidewall spacer 116 contacts a top surface of the dielectric layer 110. Outer sidewalls of the top electrode via 120 are within the outer sidewalls of the top electrode 114. In some embodiments, the first conductive via 122 and the first conductive wire 124 may be comprised of copper or aluminum, for example. Outer sidewalls of the bottom electrode 106 are aligned with the first pair of outer sidewalls 110a of the dielectric layer 110. Outer sidewalls of the top electrode 114 and outer sidewalls of the metal layer 112 are aligned with the second pair of outer sidewalls 110b of the dielectric layer 110. In some embodiments, the first pair of outer sidewalls 110a and the second pair of outer sidewalls 110b are defined from a cross-sectional view. For example, if when viewed from above the programmable metallization cell 119 is circular/elliptical then the first pair of outer sidewalls 110a is a single continuous sidewall when viewed from above, therefore the first "pair" of outer sidewalls 110a refers to the nature of this single continuous sidewall when depicted in in a cross-sectional view. Additionally, if when viewed from above the programmable metallization cell 119 is circular or elliptical then any length associated with a cross-sectional view of the layers comprising the programmable metallization cell 119 respectively correspond to diameters of a circle or lengths defined between two vertices on the major axis of an ellipse.

During operation, the programmable metallization cell 119 relies on redox reactions to form and dissolve a conductive bridge in a region 107 between the top electrode 114 and bottom electrode 106. The existence of a conductive bridge in region 107 between the top electrode 114 and bottom electrode 106 produces a low resistance state, while the absence of a conductive bridge in region 107 results in a high resistance state. Thus, the programmable metallization cell 119 can be switched between the high resistance state and low resistance state by applying appropriate biases to the cell to produce or dissolve a conductive bridge in region 107.

To facilitate this switching, one of the top or bottom electrodes is electrochemically inert, while the other is electrochemically active. For example, in some embodiments, the bottom electrode 106 can be relatively inert and can be made of titanium nitride (TIN), tantalum nitride (TaN), tantalum, titanium, platinum, nickel, hafnium, zirconium, or tungsten, among others; and/or the top electrode 114 (and/or metal layer 112) can be electrochemically active and can be made of silver, copper, aluminum, or tellurium, among others. In other embodiments the compositions of the top and bottom electrodes can be flipped relative to what is described above, such that the bottom electrode is electrochemically active and the top electrode is inert. In some embodiments, the dielectric layer 110 can manifest as a thin film of solid electrolyte, which is a solid material with highly mobile ions. For example, in some embodiments the dielectric layer 110 can be made of hafnium oxide ($HfO_2$), zirconium oxide ($ZrO_2$), Aluminum oxide ($Al_2O_3$), amorphous silicon, or silicon nitride ($Si_3N_4$), among others.

To improve performance by making the location and shape of the conductive bridge more repeatable, a heat dispersion layer 108 is disposed over the bottom electrode 106. Outer sidewalls of the heat dispersion layer 108 may be aligned with the first pair of outer sidewalls 110a of the dielectric layer 110, and with outer sidewalls of the bottom electrode 106. The heat dispersion layer 108 is comprised of materials with thermal conductivity greater than 100 W/m-K disposed between an interface between the dielectric layer 110 and bottom electrode 106. In some embodiments, the heat dispersion layer 108 may be comprised of aluminum nitride (AlN), silicon carbide (SiC), beryllium oxide (BeO), or boron nitride (BN). The presence of the heat dispersion layer 108 between the dielectric layer 110 and bottom electrode 106 prevents heat from building up at the interface. By preventing this heat buildup, the heat dispersion layer 108 limits large variation of set/reset voltage, and makes the location and/or shape of the conductive bridge more repeatable and/or uniform within the dielectric layer 110. Thus, the heat dispersion layer 108 increases the stability, endurance, and read/write time of the programmable metallization cell 119.

Figure 2:
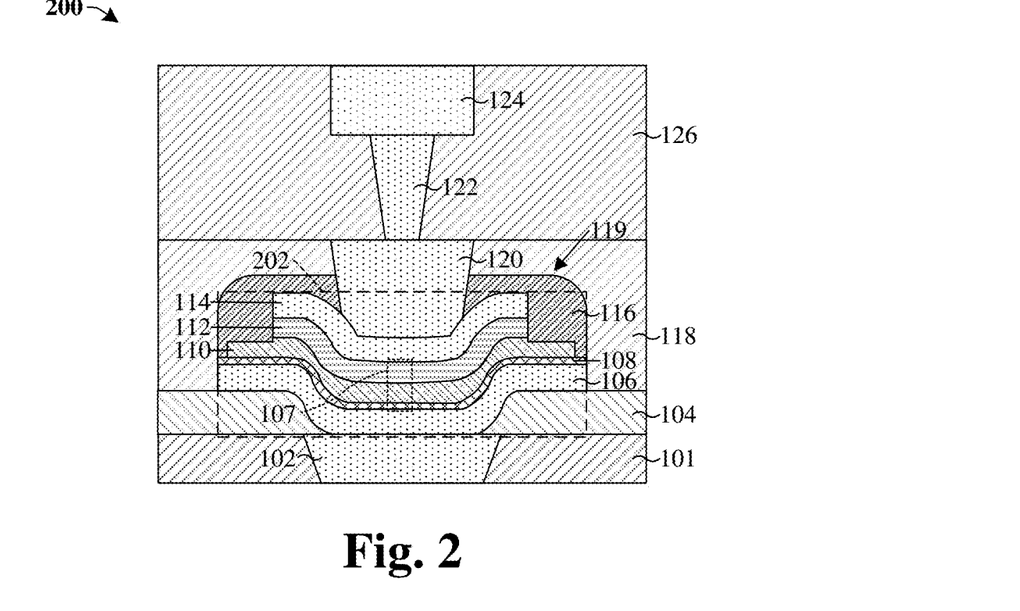

FIG. 2 illustrates a cross-sectional view of some additional embodiments of a PMCRAM device 200.

The PMCRAM device 200 includes an ILD 101 with a dielectric layer 104 disposed over the ILD 101. A bottom interconnect via 102 disposed within the ILD 101. A programmable metallization cell 119 disposed over the bottom interconnect via 102. The programmable metallization cell 119 comprises: a bottom electrode 106 disposed within the dielectric layer 104, a heat dispersion layer 108 disposed over the bottom electrode 106, and a dielectric layer 110 disposed over the heat dispersion layer 108. The programmable metallization cell 119 further comprises: a metal layer 112 disposed over the dielectric layer 110, a top electrode 114 disposed over the metal layer 112, and a sidewall spacer 116 disposed around the top electrode 114, the metal layer 112, and the dielectric layer 110.

A top electrode via 120 is disposed over the top electrode 114. An inter-level dielectric (ILD) layer 118 is formed around the programmable metallization cell 119. A second ILD layer 126 is disposed over the ILD layer 118. A first conductive via 122 is disposed over the top electrode via 120. A first conductive wire 124 is disposed over the first conductive via 122. The sidewall spacer 116 comprises a pair of outer sidewalls defined by outermost sidewalls of the top electrode 114 and outermost sidewalls of the metal layer 112. The programmable metallization cell 119 contains a film stack 202 comprising: the bottom electrode 106, heat dispersion layer 108, dielectric layer 110, metal layer 112, and top electrode 114. The film stack 202 comprises a middle region over the bottom interconnect via 102 and a peripheral region beneath the pair of outer sidewalls of the sidewall spacer 116. A bottom surface of the middle region of the film stack 202 is below a bottom surface of the peripheral region of the film stack 202. The heat dispersion layer 108 comprises a central region over the bottom interconnect via 102 and a peripheral region beneath the pair of outer sidewalls of the sidewall spacer 116. In some embodiments, a top surface of the central region of the heat dispersion layer 108 is below a bottom surface of the peripheral region of the heat dispersion layer 108.

In some embodiments, the heat dispersion layer 108 is formed to a thickness within a range of between approximately 1 Angstrom and 31 Angstroms. In some embodiments, the bottom electrode 106 is comprised of materials with thermal conductivity less than 100 W/m-K. In some embodiments, the bottom electrode 106 may be comprised of titanium nitride (TiN), tantalum nitride (TaN), tantalum (Ta), titanium (Ti), platinum (Pt), nickel (Ni), hafnium (Hf), or zirconium (Zr), for example. In some embodiments, the dielectric layer 110 may be comprised of hafnium oxide ($HfO_2$), zirconium dioxide ($ZrO_2$), aluminum oxide ($Al_2O_3$), amorphous silicon (a-Si), or silicon nitride (SiN), for example. In some embodiments, the metal layer 112 may be comprised of silver (Ag), copper (Cu), aluminum (Al), or tellurium (Te), for example.

In some embodiments, the bottom electrode 106 is formed to a thickness within a range of between approximately 100 Angstroms and 300 Angstroms with a length within a range of between approximately 15 nm and 550 nm. In some embodiments, the heat dispersion layer 108 is formed to a thickness within a range of between approximately 15 Angstroms and 75 Angstroms with a length within a range of between approximately 15 nm and 550 nm. In some embodiments, the heat dispersion layer 108 is formed to a thickness within a range of between approximately 15 Angstroms and 75 Angstroms with a length within a range of between approximately 15 nm and 550 nm. In some embodiments, the dielectric layer 110 is formed to a thickness within a range of between approximately 5 Angstroms and 75 Angstroms with a length within a range of between approximately 15 nm and 550 nm. In some embodiments, the metal layer 112 is formed to a thickness within a range of between approximately 250 Angstroms and 450 Angstroms with a length within a range of between approximately 15 nm and 550 nm. In some embodiments, the top electrode 114 is formed to a thickness within a range of between approximately 100 Angstroms and 350 Angstroms with a length within a range of between approximately 15 nm and 550 nm.

Figure 3A:
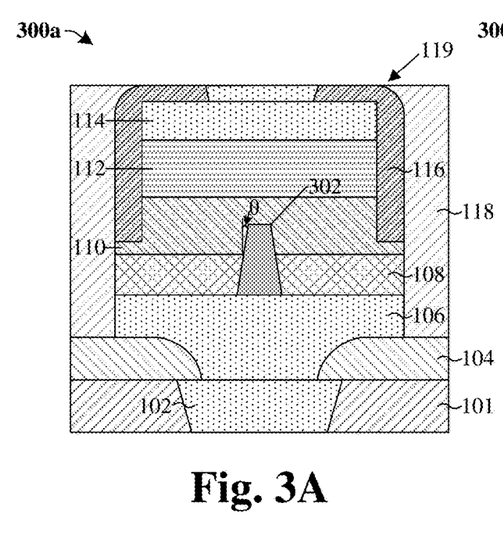

FIG. 3A illustrates a cross-sectional view of some additional embodiments of a PMCRAM device 300a.

The PMCRAM device 300a includes an ILD 101 with a dielectric layer 104 disposed over the ILD 101. A bottom interconnect via 102 is disposed within the ILD 101. A programmable metallization cell 119 is disposed over the bottom interconnect via 102. The programmable metallization cell comprises: a bottom electrode 106 disposed within the dielectric layer 104, a heat dispersion layer 108 disposed over the bottom electrode 106, a dielectric layer 110 disposed over the heat dispersion layer 108. The programmable metallization cell further comprises: a metal layer 112 disposed over the dielectric layer 110, a top electrode 114 disposed over the metal layer 112, a sidewall spacer 116 disposed around the top electrode 114, the metal layer 112 and the dielectric layer 110.

FIG. 3A illustrates one embodiment of a first state 300a of the programmable metallization cell 119. The programmable metallization cell 119 is in a high resistance state, a conductive base 302 (in some embodiments, known as a conductive pillar) is formed within the dielectric layer 110 and the heat dispersion layer 108. In some embodiments, the high resistance state is achieved after an optimized reset state is performed on the programmable metallization cell 119. A bottom surface of the conductive base 302 contacts a top surface of the bottom electrode 106. In some embodiments, the conductive base 302 is within outer most sidewalls of the bottom interconnect via 102. The bottom surface of the conductive base 302 comprises a first width, a top surface of the conductive base 302 comprises a second width. The first width is greater than the second width. Sidewalls of the conductive base 302 are angled at a non-zero angle θ relative to a line perpendicular to the top surface of the heat dispersion layer 108. The top surface of the conductive base 302 is below a bottom surface of the metal layer 112. In this high resistance state, the bottom electrode 106 is electrically isolated from the metal layer 112.

Figure 3B:
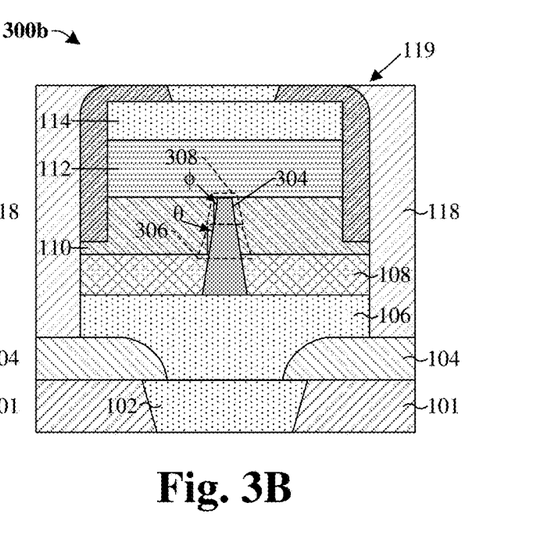

FIG. 3B illustrates one embodiment of a second state 300b of the programmable metallization cell 119. The programmable metallization cell 119 is in a low resistance state (in some embodiments, also called a set state), a conductive bridge 304 is formed within the dielectric layer 110 and the heat dispersion layer 108. A bottom surface of the conductive bridge 304 contacts a top surface of the bottom electrode 106. In some embodiments, the conductive bridge 304 is within outer most sidewalls of the bottom interconnect via 102. The bottom surface of the conductive bridge 304 comprises a first width, a top surface of the conductive bridge 304 comprises a second width. The first width is greater than the second width. Sidewalls of the conductive bridge 304 are angled at a non-zero angle relative to a line perpendicular to the top surface of the heat dispersion layer 108. The top surface of the conductive bridge 304 is in contact with a bottom surface of the metal layer 112. In this low resistance state, the bottom electrode 106 is electrically coupled to the metal layer 112.

Figure 3C:
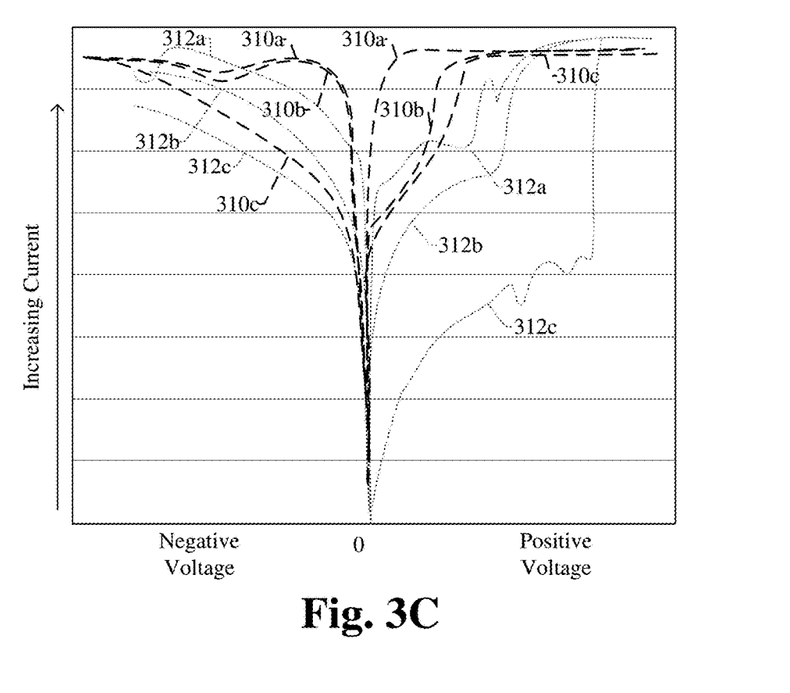
FIG. 3C illustrates a graph which sets forth Current-Voltage (IV) characteristics for a number of different devices and highlight some performance examples of a memory device including a programmable metallization cell, according to the present disclosure.

FIG. 3C illustrates a series of IV curves of embodiments of a memory device including a programmable metallization cell, such as previously illustrated and described in FIG. 1. These IV curves reflect varying numbers of set and reset operations being carried out on the programmable metallization cell. In the set and reset operations, for example, a voltage is applied across the bottom electrode 106 and the metal layer 112, and the amount of current over the metallization cell varies as a function of the applied voltage, which dictates to what extent a conductive bridge 304 is present. Thus, in the set operation, the applied (e.g., positive) voltage induces formation of the conductive bridge 304 in the dielectric layer 110, whereas in the reset operation, the applied (e.g., negative) voltage removes at least a portion of the conductive bridge 304 from the dielectric layer 110 (or vice versa). Thus, the programmable metallization cells show typical bi-stable I-V curves demonstrating bipolar switching for the cells.

More particularly in FIG. 3C, the IV curves 310a, 310b, and 310c relate to some embodiments in accordance with the present disclosure, in which the programmable metallization cells includes a heat dispersion layer. These curves 310a, 310b, 310c depict how the IV curves change in time as more set and reset operations are applied to the cell. Thus, the first IV curve 310a is achievable, for example, up to 100 set and reset operations; the second IV curve 310b is generally followed after 100 set and reset operations and before 10,000 set and reset operations; and the third IV curve is generally followed after more than 10,000 set and reset operations have been carried out on the cell.

Other IV curves 312a, 312b, and 312c represent varying numbers of set and reset operations being applied to a second programmable metallization cell that lacks a heat dispersion layer. Thus, the fourth IV curve 312a is achievable, for example, up to 100 set and reset operations of this second programmable metallization cell; the fifth IV curve 312b is generally followed after 100 set and reset operations and before 10,000 set and reset operations; and the sixth IV curve 312c is generally followed after more than 10,000 set and reset operations have been carried out on the second programmable metallization cell. In some cases, this second metallization cell may fail, for example, after 100 set/reset operations.

As can be seen by a comparison of curves 310a-c and 312a-c, this second programmable metallization cell that lacks a heat dispersion layer (curves 312a, 312b, 312c) suffers from endurance degradation due to shifting and/or random formation of a conductive bridge within a dielectric layer of the of the second programmable metallization cell. After a large number of set and reset operations the endurance degradation requires, for example, a larger absolute voltage to be applied to the second programmable metallization cell in order to carry out the set and reset operations. Thus, after the number of set and reset operations, the programmable metallization cells of the present disclosure, which include a heat dispersion layer, have smaller set and reset voltage variations than the set and reset voltage variations of the second programmable metallization cell. Therefore, the heat dispersion layer 108 of the programmable metallization cell 119 increases the PMCRAM device's endurance while decreasing the set and reset voltage variations.

In some embodiments, the conductive bridge 304 comprises two sections. A first section 306, in some embodiments the first section 306 contains the same physical shape and characteristics of the conductive base (302 of FIG. 3A). A bottom surface of a second section 308 is in direct contact with a top surface of the first section 306. The bottom surface of the second section 308 has the same width as the top surface of the first section 306. A width of a top surface of the second section 308 is less than the width of the bottom surface of the second section 308. Sidewalls of the first section 306 are angled at a first non-zero angle θ relative to a line perpendicular to the top surface of the heat dispersion layer 108. Sidewalls of the second section 308 are angled at a second non-zero angle φ relative to a line perpendicular to the top surface of the heat dispersion layer 108. The first non-zero angle θ is a different angle than the second non-zero angle φ. In some embodiments, the first non-zero angle θ is greater than the second non-zero angle φ. In some embodiments, the second non-zero angle φ is within a range of 1 degree and 60 degrees. In some embodiments, the first non-zero angle θ is within a range of 1 degree and 60 degrees.

In some embodiments, the programmable metallization cell 119 is toggled between the high resistance state (FIG. 3A) and the low resistance state (FIG. 3B). The switching process comprises applying a set voltage to achieve the low resistance state. Referring to FIG. 3B, the set voltage will form the second section 308. Then, a reset voltage is applied to the programmable metallization cell 119, removing the second section 308, leaving only the first section 306, and switching the programmable metallization cell 119 to a high resistance state (FIG. 3A). This process can be repeated as many times as desired. Switching time is reduced compared to conventional PMCRAM devices because the first section 306 is present in the high resistance state and low resistance state.

Figure 4:
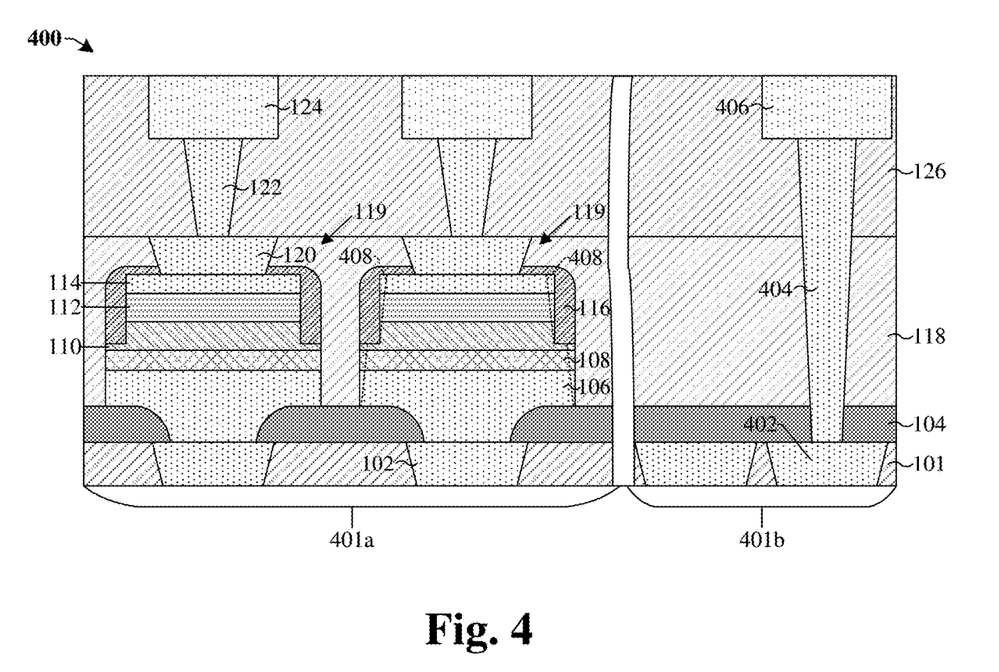
FIG. 4 illustrates a cross-sectional view of some embodiments of a memory device including an embedded memory region comprising two programmable metallization cells and a logic region, according to the present disclosure.

Referring to FIG. 4, a cross-sectional view of a memory device 400 in accordance with some embodiments is provided.

The memory device 400 comprises an embedded memory region 401a and a logic region 401b. The embedded memory region 401a comprises a dielectric layer 104 disposed over the ILD 101. A bottom interconnect via 102 is disposed within the ILD 101. The memory device 400 comprises two programmable metallization cells. A programmable metallization cell 119 comprises: a bottom electrode 106 disposed within the dielectric layer 104, a heat dispersion layer 108 disposed over the bottom electrode 106, a dielectric layer 110 disposed over the heat dispersion layer 108. The programmable metallization cell 119 further comprises: a metal layer 112 disposed over the dielectric layer 110, a top electrode 114 disposed over the metal layer 112, a sidewall spacer 116 disposed around the top electrode 114, the metal layer 112 and the dielectric layer 110. In some embodiments, the programmable metallization cell 119 comprises angled sidewalls 408. The angled sidewalls 408 contain a nonzero angle relative to a line perpendicular to a top surface of the bottom interconnect via 102. A top electrode via 120 is disposed over the top electrode 114. An ILD layer 118 is formed around the programmable metallization cell 119. A second ILD layer 126 is disposed over the ILD layer 118. A first conductive via 122 is disposed over the top electrode via 120. A first conductive wire 124 is disposed over the first conductive via 122.

The logic region 401b comprises a bottom interconnect via 402 disposed within the ILD 101. The dielectric layer 104 is disposed over the ILD 101. The ILD layer 118 is disposed over the dielectric layer 104. The second ILD layer 126 is disposed over the ILD layer 118. A second conductive via 404 is disposed over the bottom interconnect via 402. In some embodiments, the second conductive via 404 is comprised of copper or aluminum, for example. A second conductive wire 406 is disposed over the second conductive via 404. In some embodiments, the second conductive wire 406 is comprised of copper or aluminum, for example. Sidewalls of the second conductive wire 406 extend past sidewalls of the second conductive via 404.

Figure 5A:
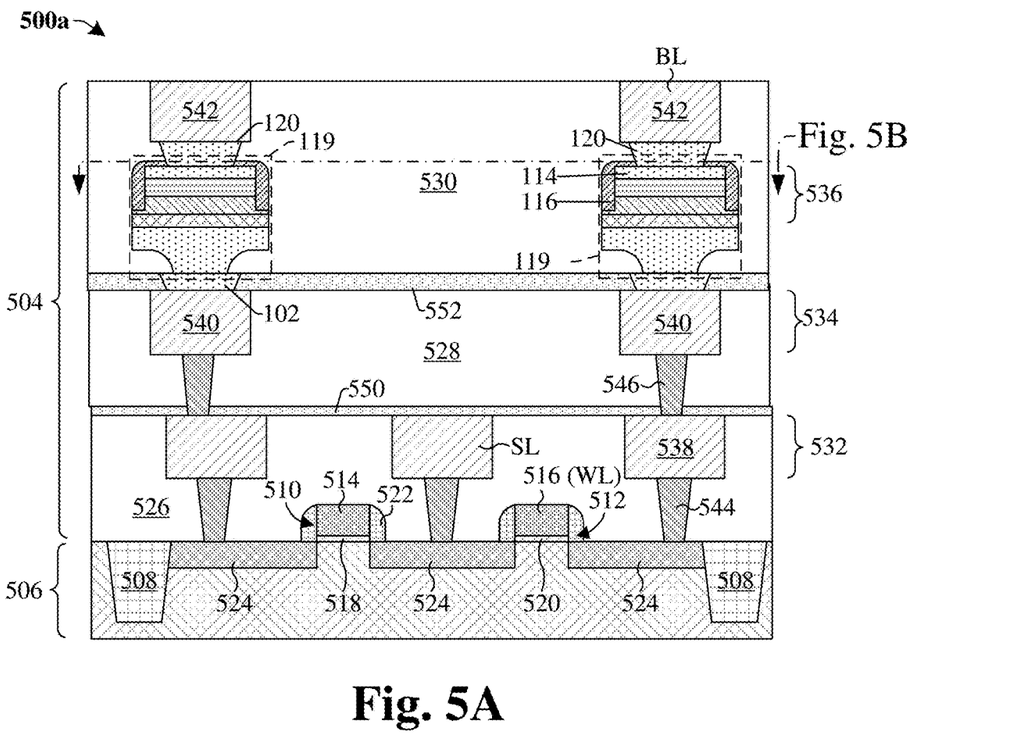
FIG. 5A illustrates a cross-sectional view of some embodiments of a memory device including two programmable metallization cells.

Referring to FIG. 5A, a cross-sectional view of a memory device 500a in accordance with some embodiments is provided.

The memory device 500a which includes programmable metallization cells 119, programmable metallization cells 119 disposed in an interconnect structure 504 between neighboring metal layers of the memory device 500a. The memory device 500a includes a substrate 506. The substrate 506 may be, for example, a bulk substrate (e.g., a bulk silicon substrate) or a silicon-on-insulator (SOI) substrate. The illustrated embodiment depicts one or more shallow trench isolation (STI) regions 508, which may include a dielectric-filled trench within the substrate 506. A cut-line is disposed directly above a top surface of the sidewall spacer 116 of both programmable metallization cells 119. The cut-line crosses through the top electrode 120 of both programmable metallization cells 119.

Two access transistors 510, 512 are disposed between the STI regions 508. The access transistors 510, 512 include access gate electrodes 514, 516, respectively; access gate dielectrics 518, 520, respectively; access sidewall spacers 522; and source/drain regions 524. The source/drain regions 524 are disposed within the substrate 506 between the access gate electrodes 514, 516 and the STI regions 508, and are doped to have a first conductivity type which is opposite a second conductivity type of a channel region under the gate dielectrics 518, 520, respectively. The word line gate electrodes 514, 516 may be, for example, doped polysilicon or a metal, such as aluminum, copper, or combinations thereof. The word line gate dielectrics 518, 520 may be, for example, an oxide, such as silicon dioxide, or a high-K dielectric material. The word line sidewall spacers 522 can be made of silicon nitride (e.g., $Si_3N_4$), for example.

The interconnect structure 504 is arranged over the substrate 506 and couples devices (e.g., transistors 510, 512) to one another. The interconnect structure 504 includes a plurality of IMD layers 526, 528, 530, and a plurality of metallization layers 532, 534, 536 which are layered over one another in alternating fashion. The IMD layers 526, 528, 530 may be made, for example, of a low κ dielectric, such as un-doped silicate glass, or an oxide, such as silicon dioxide, or an extreme low κ dielectric layer. The metallization layers 532, 534, 536 include metal lines 538, 540, 542, which are formed within trenches, and which may be made of a metal, such as copper or aluminum. Contacts 544 extend from the bottom metallization layer 532 to the source/drain regions 524 and/or gate electrodes 514, 516; and vias 546 extend between the metallization layers 532, 534, 536. The contacts 544 and the vias 546 extend through dielectric-protection layers 550, 552 (which can be made of dielectric material and can act as etch stop layers during manufacturing). The dielectric-protection layers 550, 552 may be made of an extreme low-K dielectric material, such as SiC, for example. The contacts 544 and the vias 546 may be made of a metal, such as copper or tungsten, for example.

Figure 5B:
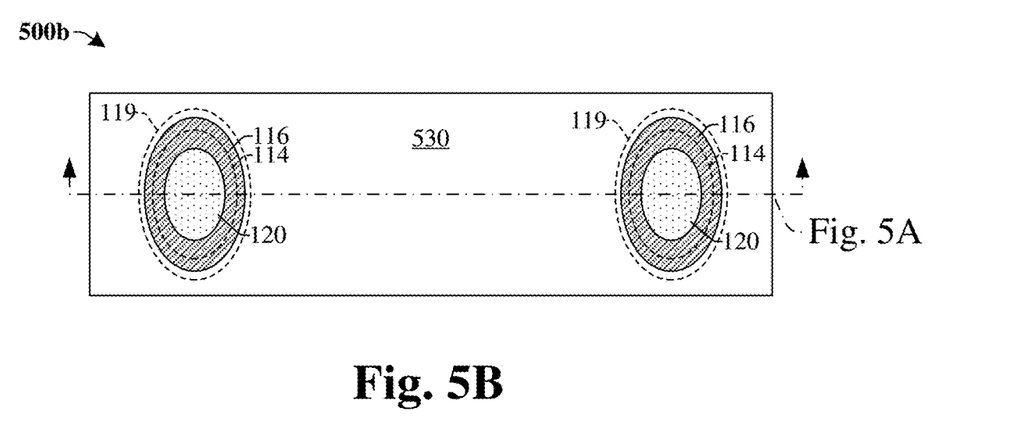
FIG. 5B illustrates a top view of the memory device of FIG. 5A, as indicated by the cut-line in FIG. 5A.

Referring to FIG. 5B, a top view of the memory device 500a of FIG. 5A in accordance with some embodiments is provided.

As shown in FIG. 5B, the programmable memory metallization cells 119 have a circular/elliptical shape or a square/rectangular shaped when viewed from above in some embodiments. In other embodiments, however, for example due to partialities of many etch processes, the corners of a square or rectangular shape can become rounded, resulting in programmable memory metallization cells 119 having a square or rectangular shape with rounded corners, or having a circular or elliptical shape. The programmable memory metallization cells 119 are arranged over metal lines 740, and have upper portions in direct electrical connection with the metal lines 742 without vias or contacts there between in some embodiments. In other embodiments, the top electrode via 120 couple the upper portion to the metal lines 742. When viewed from above, the top electrode 120, top electrode 114, and sidewall spacer 116 can have the same circular/elliptical shape or square/rectangular shape as the programmable memory metallization cells 119.

FIGS. 6-10 illustrate cross-sectional views 600-1000 of some embodiments of a method of forming a memory device including a programmable metallization cell according to the present disclosure. Although the cross-sectional views 600-1000 shown in FIGS. 6-10 are described with reference to a method, it will be appreciated that the structures shown in FIGS. 6-10 are not limited to the method but rather may stand alone separate of the method. Although FIGS. 6-10 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
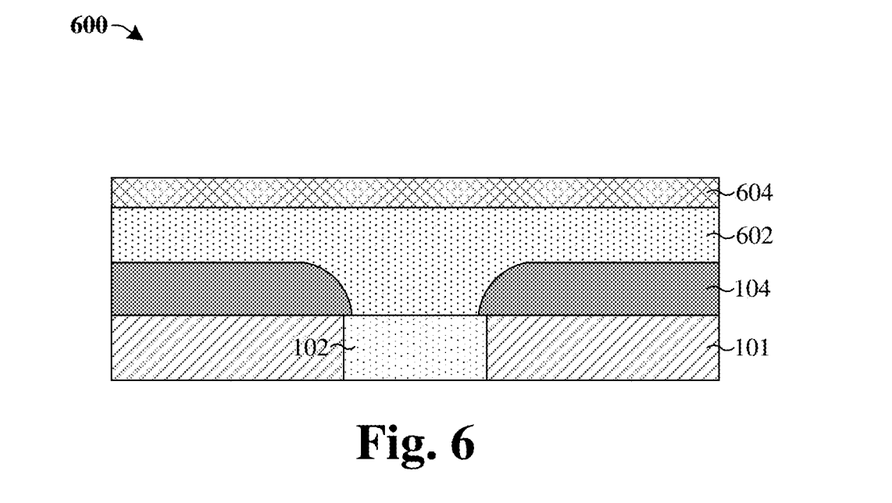
FIGS. 6-10 illustrate cross-sectional and/or top views of some embodiments of a method of forming a memory device including an embedded memory region and a logic region, according to the present disclosure.

As shown in cross-sectional view 600 of FIG. 6, a bottom interconnect via 102 is formed within an ILD 101. A dielectric layer 104 is formed over the ILD 101. A bottom electrode film 602 is formed over the bottom interconnect via 102 and dielectric layer 104. In some embodiments, the bottom electrode film 602 is comprised of materials with thermal conductivity less than 100 W/m-K. In some embodiments, the bottom electrode film 602 may be comprised of titanium nitride (TiN), tantalum nitride (TaN), tantalum (Ta), titanium (Ti), platinum (Pt), nickel (Ni), hafnium (Hf), or zirconium (Zr), for example. A heat dispersion film 604 is formed over the bottom electrode film 602. In some embodiments, the heat dispersion film 604 is comprised of materials with thermal conductivity greater than 100 W/m-K. In some embodiments, the heat dispersion film 604 may be comprised of aluminum nitride (AlN), silicon carbide (SiC), beryllium oxide (BeO), or boron nitride (BN).

Figure 7:
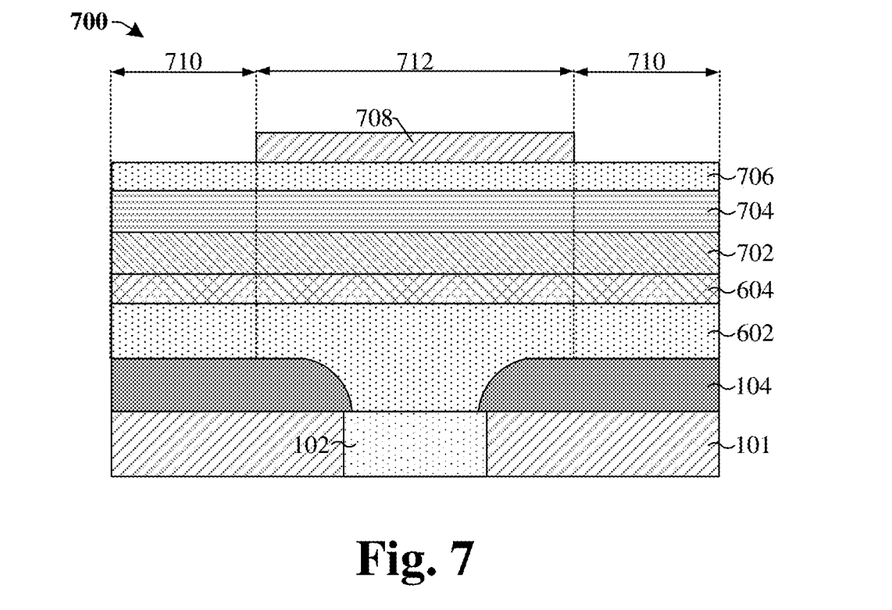

As shown in cross-sectional view 700 of FIG. 7, a dielectric film 702 is formed over the heat dispersion film 604. A metal film 704 is formed over the dielectric film 702. A top electrode film 706 is formed over the metal film 704. A masking layer 708 is formed over the electrode film 706. The masking layer 708 covers a center region 712 of the top electrode film 706. The masking layer 708 leaves a sacrificial portion 710 of an upper surface of the top electrode film 706 uncovered and exposed. In some embodiments, the masking layer 708 includes a photoresist mask. In other embodiments, the masking layer may comprise a hardmask layer (e.g., comprising a nitride layer). In some embodiments, the masking layer may comprise a multi-layer hard mask.

Figure 8:
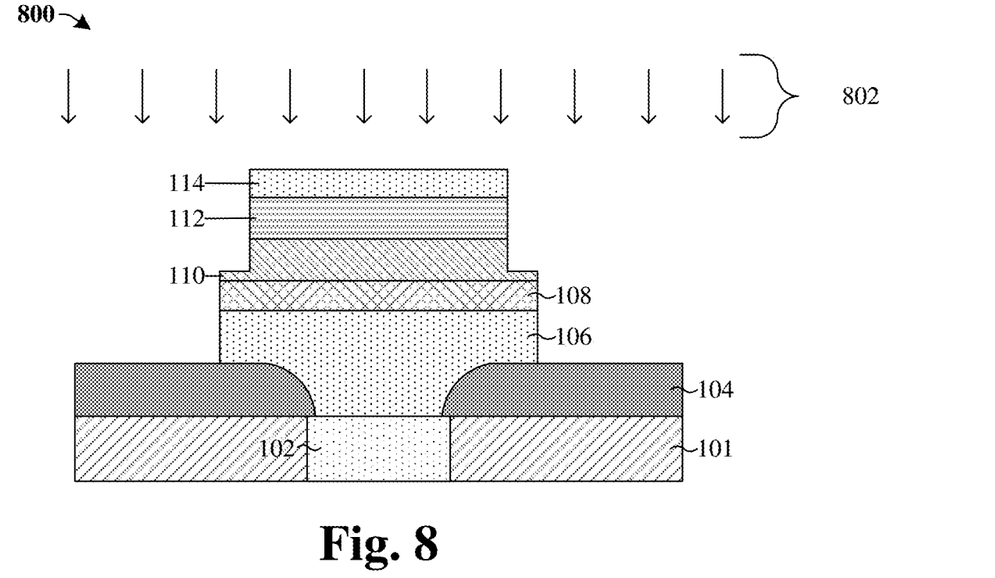

As shown in cross-section view 800 of FIG. 8, an etching process is performed to etch the bottom electrode film (602 of FIG. 7), the heat dispersion film (604 of FIG. 7), the dielectric film (702 of FIG. 7), the metal film (704 of FIG. 7), the top electrode film (706 of FIG. 7), and masking layer (708 of FIG. 7) respectively defining a bottom electrode 106, heat dispersion layer 108, dielectric layer 110, metal layer 112, and top electrode 114. The etching process involves exposing the sacrificial portion (710 of FIG. 7) to an etchant 802. Outer most sidewalls of the bottom electrode 106, heat dispersion layer 108, and dielectric layer 110 are aligned. A second pair of sidewalls of the dielectric layer 110 are within the outer most sidewalls of the dielectric layer 110. The second pair of sidewalls of the dielectric layer 110 are aligned with outermost sidewalls of the metal layer 112, and top electrode 114.

Figure 9:
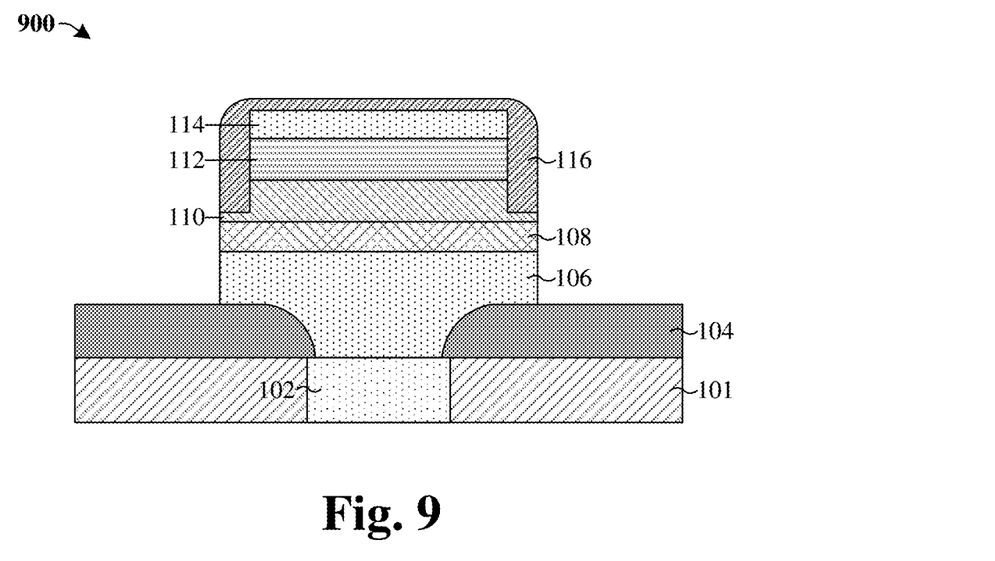

As shown in cross-section view 900 of FIG. 9, a sidewalls spacer 116 is formed around the dielectric layer 110, metal layer 112, and the top electrode 114. A bottom surface of the sidewall spacer 116 contacts a top surface of the dielectric layer 110. Outermost sidewalls of the sidewall spacer 116 are aligned with outermost sidewalls of the bottom electrode 106 and heat dispersion layer 108.

Figure 10:
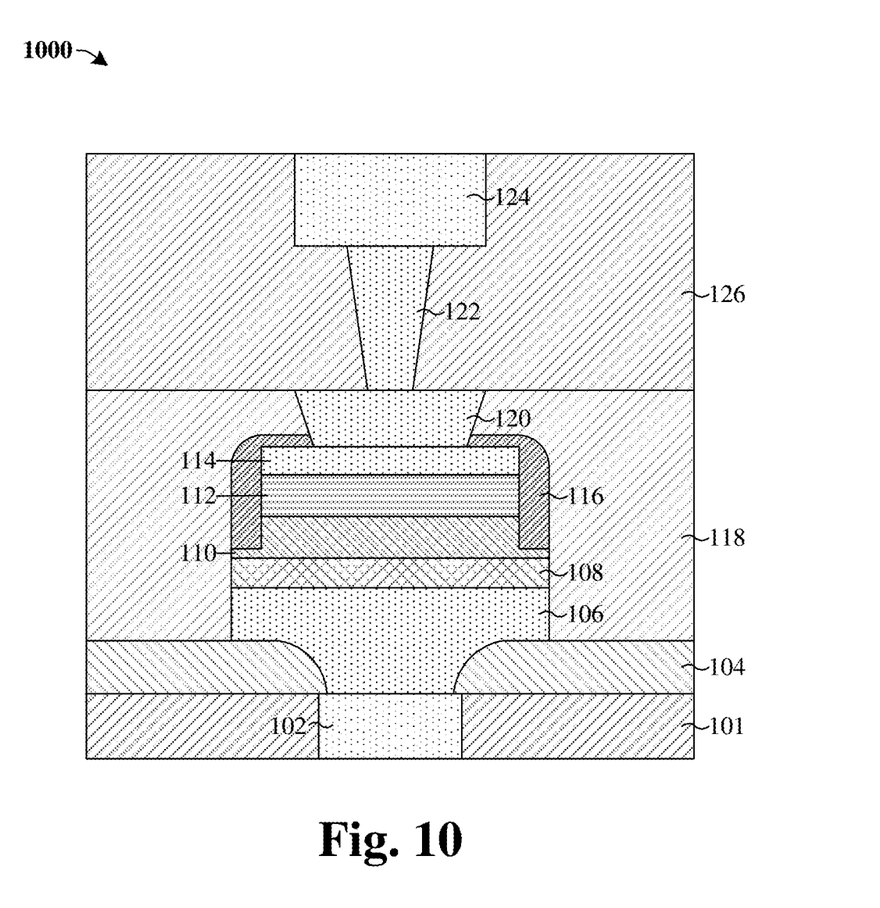

As shown in cross-section view 1000 of FIG. 10, a top electrode via 120 is formed over the top electrode 114. An ILD layer 118 is formed around the sidewall spacer 116, bottom electrode 106, and heat dispersion layer 108. A second ILD layer 126 is formed over the ILD layer 118 and the top electrode via 120. A first conductive via 122 is formed over the top electrode via 120. In some embodiments, the first conductive via 122 may be comprised of copper or aluminum. A first conductive wire 124 is formed over the first conductive via 122. In some embodiments, the first conductive wire 124 may be comprised of copper or aluminum, for example. The first conductive wire 124 extends past sidewalls of the first conductive via 122 and connects to a bit line (not shown). The second ILD layer 126 surrounds the first conductive via 122 and the first conductive wire 124.

Figure 11:
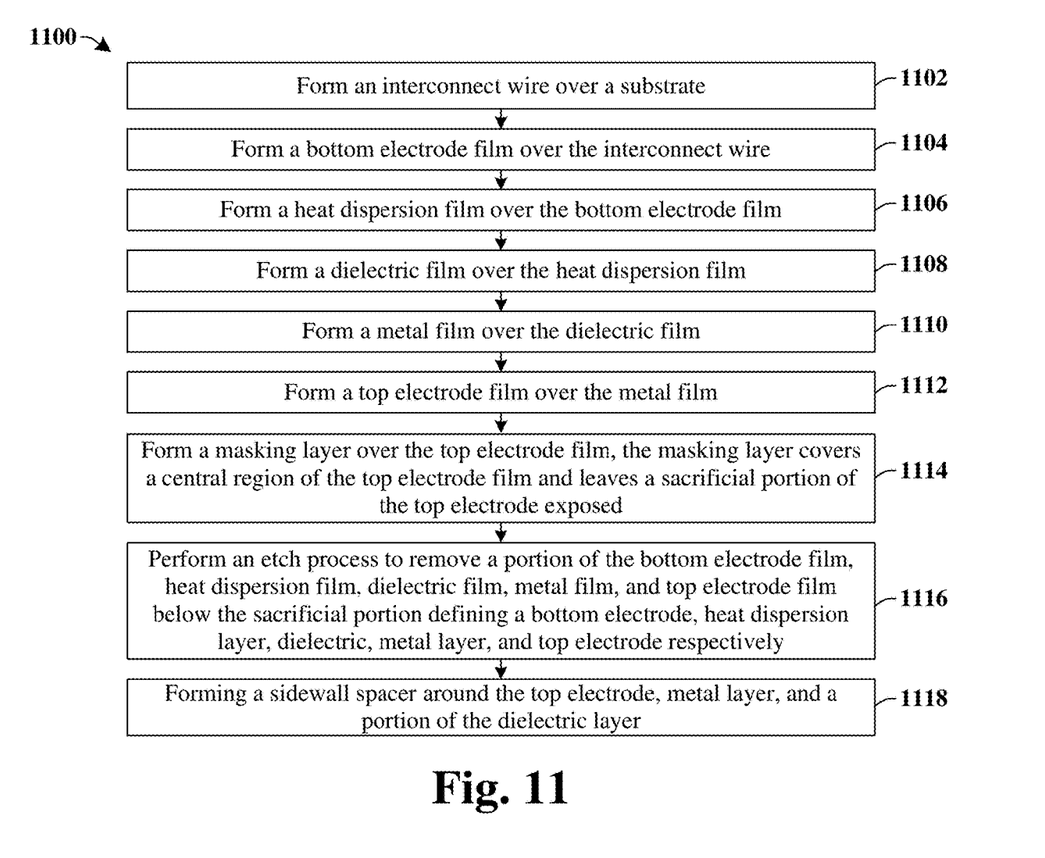
FIG. 11 illustrates a methodology in flowchart format that illustrates some embodiments of a method of forming a memory device including a programmable metallization cell, according to the present disclosure.

FIG. 11 illustrates a method 1100 of forming a memory device in accordance with some embodiments. Although the method 1100 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1102, an interconnect wire is formed over a substrate. FIG. 6 illustrates a cross-sectional view 600 corresponding to some embodiments of act 1102.

At 1104, a bottom electrode film is formed over the interconnect wire. FIG. 6 illustrates a cross-sectional view 600 corresponding to some embodiments of act 1104.

At 1106, a heat dispersion film is formed over the bottom electrode film. FIG. 6 illustrates a cross-sectional view 600 corresponding to some embodiments of act 1106.

At 1108, a dielectric film is formed over the heat dispersion film. FIG. 7 illustrates a cross-sectional view 700 corresponding to some embodiments of act 1108.

At 1110, a metal film is formed over the dielectric film. FIG. 7 illustrates a cross-sectional view 700 corresponding to some embodiments of act 1110.

At 1112, a top electrode film is formed over the metal film. FIG. 7 illustrates a cross-sectional view 700 corresponding to some embodiments of act 1112.

At 1114, a masking layer is formed over the top electrode film, the masking layer covers a central region of the top electrode film and leaves a sacrificial portion of the top electrode film exposed. FIG. 7 illustrates a cross-sectional view 700 corresponding to some embodiments of act 1114.

At 1116, an etching process is performed to remove a portion of the bottom electrode film, heat dispersion film, dielectric film, metal film, and top electrode film below the sacrificial portion defining a bottom electrode, heat dispersion layer, dielectric, metal layer, and top electrode respectively. FIG. 8 illustrates a cross-sectional view 800 corresponding to some embodiments of act 1116.

At 1118, a sidewall spacer is formed around the top electrode, metal layer, and a portion of the dielectric layer. FIG. 9 illustrates a cross-sectional view 900 corresponding to some embodiments of act 1118.

Accordingly, in some embodiments, the present disclosure relates to a method of forming a programmable metallization cell that comprises a heat dispersion layer formed between a bottom electrode and a dielectric, the heat dispersion layer is comprised of materials with thermal conductivity greater than 100 W/m-K.

In some embodiments, the present disclosure relates to a PMCRAM device. The PMCRAM device includes a dielectric layer disposed over a bottom electrode, the dielectric layer contains a central region, a conductive bridge is formable and erasable within the dielectric layer, and the conductive bridge is contained within the central region of the dielectric layer; a metal layer disposed over the dielectric layer; a heat dispersion layer disposed between the bottom electrode and the dielectric layer.

In other embodiments, the present disclosure relates to a memory device. The memory device includes a conductive bridging random access memory (CBRAM) cell disposed over an interconnect wire, the programmable metallization cell comprises a metal ion reservoir disposed between a top electrode and a bottom electrode, an electrolyte is disposed between the metal ion reservoir and the bottom electrode, a heat dispersion layer is disposed between the bottom electrode and the electrolyte; the electrolyte comprises a conductive bridge region over the interconnect wire, the conductive bridge region is defined between a top surface of the heat dispersion layer and a bottom surface of the metal ion reservoir, a conductive bridge is formable and erasable within the conductive bridge region.

In yet other embodiments, the present disclosure relates to a method for manufacturing a memory device. The method includes forming a bottom electrode over an interconnect wire, the interconnect wire is formed over a substrate; forming a heat dispersion layer over the bottom electrode; forming a dielectric layer over the heat dispersion layer; forming a metal layer over the dielectric layer; forming a top electrode over the metal layer; forming a masking layer over the top electrode, the masking layer covers a center region of the top electrode, the masking layer leaves a sacrificial portion of the top electrode exposed; performing a first etch process to remove a portion of the bottom electrode, heat dispersion layer, dielectric layer, metal layer, and top electrode below the sacrificial portion of the top electrode; forming a sidewalls spacer around the top electrode, metal layer, and a portion of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device, comprising:
    forming a bottom electrode over a substrate;
    forming a heat dispersion layer over the bottom electrode, wherein a bottommost surface of the heat dispersion layer is above a bottom surface of the bottom electrode;
    forming a dielectric layer over the heat dispersion layer;
    forming a top electrode over the dielectric layer; and
    wherein the heat dispersion layer comprises a first dielectric material.

2. The method of claim 1, wherein forming the dielectric layer includes:

etching the dielectric layer such that a width of the dielectric layer discretely increases from a top surface of the dielectric layer in a direction towards the substrate.

3. The method of claim 1, wherein the first dielectric material has a thermal conductivity greater than 100 W/m-K.

4. The method of claim 1, wherein the first dielectric material is comprised of aluminum nitride, silicon carbide, beryllium oxide, or boron nitride.

5. The method of claim 1, wherein the dielectric layer comprises a second dielectric material different than the first dielectric material.

6. The method of claim 1, further comprising:
forming a metal layer between the top electrode and the dielectric layer, wherein the metal layer comprises a different material than the bottom electrode.

7. The method of claim 1, wherein a thermal conductivity of the heat dispersion layer is greater than a thermal conductivity of the bottom electrode.

8. The method of claim 1, further comprising:
forming a sidewall spacer around sidewalls of the top electrode and sidewalls of the dielectric layer, wherein the sidewall spacer contacts an upper surface of the dielectric layer.

9. The method of claim 1, wherein opposing sidewalls of the dielectric layer are spaced between or aligned with opposing sidewalls of the heat dispersion layer.

10. A method for manufacturing a memory device, comprising:
forming a bottom electrode over a substrate;
forming a first dielectric layer over the bottom electrode;
forming a second dielectric layer over the first dielectric layer;
forming a top electrode over the second dielectric layer;
forming a metal layer between the top electrode and the second dielectric layer,
wherein outer sidewalls of the metal layer are spaced laterally between outer sidewalls of the second dielectric layer; and
wherein a thermal conductivity of the first dielectric layer is greater than a thermal conductivity of the bottom electrode.

11. The method of claim 10, wherein a thermal conductivity of the second dielectric layer is less than the thermal conductivity of the bottom electrode.

12. The method of claim 10, wherein forming the second dielectric layer includes performing an etching process on the first dielectric layer and the second dielectric layer such that the second dielectric layer comprises a first pair of outer sidewalls aligned with outer sidewalls of the first dielectric layer, wherein the second dielectric layer comprises a second pair of outer sidewalls aligned with outer sidewalls of the top electrode, wherein the second pair of outer sidewalls are spaced laterally between the first pair of outer sidewalls.

13. The method of claim 10, further comprising:
forming a sidewall spacer around the top electrode and the second dielectric layer such that the sidewall spacer extends continuously from an upper surface of the top electrode, along a sidewall of the second dielectric layer, to an upper surface of the second dielectric layer.

14. The method of claim 10, further comprising:
forming a bottom interconnect via over the substrate; and
forming a lower dielectric layer over the bottom interconnect via, wherein the bottom electrode extends from an upper surface of the lower dielectric layer, along opposing sidewalls of the lower dielectric layer, to an upper surface of the bottom interconnect via.

15. The method of claim 10, wherein the first dielectric layer comprises aluminum nitride, silicon carbide, beryllium oxide, or boron nitride, and wherein the second dielectric layer comprises hafnium oxide, zirconium oxide, aluminum oxide, amorphous silicon, or silicon nitride.

16. A method for manufacturing a memory device, comprising:
forming a bottom electrode over an interconnect wire, wherein the interconnect wire is formed over a substrate;
forming a heat dispersion layer over the bottom electrode;
forming a dielectric layer over the heat dispersion layer;
forming a metal layer over the dielectric layer;
forming a top electrode over the metal layer;
forming a masking layer over the top electrode, wherein the masking layer covers a center region of the top electrode, wherein the masking layer leaves a sacrificial portion of the top electrode exposed;
performing a first etch process to remove a portion of the bottom electrode, heat dispersion layer, dielectric layer, metal layer, and top electrode below the sacrificial portion of the top electrode, wherein a width of the dielectric layer increases from a top surface of the dielectric layer in a direction towards the substrate; and
forming a sidewall spacer around the top electrode, metal layer, and a portion of the dielectric layer.

17. The method of claim 16, wherein the dielectric layer comprises a first dielectric material and the heat dispersion layer comprises a second dielectric material different than the first dielectric material.

18. The method of claim 16, further comprising:
forming a first inter-level dielectric (ILD) layer over the sidewall spacer;
forming a top electrode via over the top electrode;
forming a second ILD layer over the first ILD layer;
forming a first conductive via over the top electrode via; and
forming a first conductive wire over the first conductive via, wherein the first conductive wire extends past sidewalls of the first conductive via.

19. The method of claim 18, further comprising:
forming a second interconnect wire within a logic region;
forming a second conductive via over the second interconnect wire; and
forming a second conductive wire over the second conductive via, wherein the second conductive wire extends past sidewalls of the second conductive via.

20. The method of claim 16, wherein a thermal conductivity of the heat dispersion layer is less than a thermal conductivity of the metal layer.

* * * * *